(12) United States Patent
Zhu et al.

(10) Patent No.: US 12,193,310 B2
(45) Date of Patent: Jan. 7, 2025

(54) DISPLAY SUBSTRATE AND MANUFACTURING METHOD THEREOF, AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Liudong Zhu, Beijing (CN); Yiyang Zhang, Beijing (CN); Qun Ma, Beijing (CN); Chenxing Wan, Beijing (CN); Jiahao Guo, Beijing (CN); Yuqing Yang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/763,801

(22) PCT Filed: Apr. 29, 2021

(86) PCT No.: PCT/CN2021/091027
§ 371 (c)(1),
(2) Date: Mar. 25, 2022

(87) PCT Pub. No.: WO2022/226899
PCT Pub. Date: Nov. 3, 2022

(65) Prior Publication Data
US 2024/0049570 A1    Feb. 8, 2024

(51) Int. Cl.
*H10K 59/80* (2023.01)
*H10K 59/12* (2023.01)
*H10K 59/40* (2023.01)

(52) U.S. Cl.
CPC ....... *H10K 59/873* (2023.02); *H10K 59/1201* (2023.02); *H10K 59/40* (2023.02)

(58) Field of Classification Search
CPC .. H10K 59/873; H10K 59/1201; H10K 59/40; H10K 59/122; H10K 59/121
See application file for complete search history.

(56) References Cited

U.S. PATENT DOCUMENTS 11,251,384 B2    2/2022    Hsieh et al.

FOREIGN PATENT DOCUMENTS

| CN | 107644891 A | 1/2018 |
|----|-------------|--------|
| CN | 108539016 A | 9/2018 |

(Continued)

OTHER PUBLICATIONS

International Search Report of PCT/CN2021/091027 in Chinese, mailed Feb. 9, 2022.

(Continued)

*Primary Examiner* — Donald L Raleigh
(74) *Attorney, Agent, or Firm* — Collard & Roe, P.C.; William Collard

(57) ABSTRACT

A display substrate and a manufacturing method thereof, and a display device are provided. The display substrate has an opening region, a display region, and an opening peripheral region between the opening region and the display region, and includes a base substrate, the opening peripheral region includes a first barrier dam and an insulating protection layer, the first barrier dam at least partially surrounds the opening region, the insulating protection layer includes at least one first material removal region, and a projection of the first material removal region on the base substrate is overlapped with a projection of the first barrier dam on the base substrate; in the at least one first material removal region, a material of the insulating protection layer is at least (Continued)

partially removed, to form a recess portion in the insulating protection layer or a through hole penetrating the insulating protection layer.

20 Claims, 8 Drawing Sheets

(56) References Cited

FOREIGN PATENT DOCUMENTS

| CN | 110010665 A | 7/2019 |
|---|---|---|
| CN | 110246984 A | 9/2019 |
| CN | 110459694 A | 11/2019 |
| CN | 112271199 A | 1/2021 |

OTHER PUBLICATIONS

Written Opinion of PCT/CN2021/091027 in Chinese, mailed Feb. 9, 2022.

DISPLAY SUBSTRATE AND MANUFACTURING METHOD THEREOF, AND DISPLAY DEVICE

CROSS REFERENCE TO RELATED APPLICATIONS

This application is the National Stage of PCT/CN2021/091027 filed on Apr. 29, 2021, the disclosure of which is incorporated by reference.

TECHNICAL FIELD

Embodiments of the present disclosure relate to a display substrate and a manufacturing method thereof, and a display device.

BACKGROUND

Organic light-emitting diode (OLED) display panels have characteristics of self-illumination, high contrast, low energy consumption, wide viewing angle, fast response speed, being capable of being used for flexible panels, wide operating temperature range, simple manufacturing and so on, and have broad development prospects. In order to meet diversified needs of users, flexible display panels are widely used, and the flexible display panels can achieve various display effects such as curved display, narrow frame and so on.

SUMMARY

At least one embodiment of the present disclosure provides a display substrate, the display substrate has an opening region, a display region at least partially surrounding the opening region, and an opening peripheral region between the opening region and the display region, and the display substrate comprises a base substrate, the opening peripheral region comprises a first barrier dam on the base substrate and an insulating protection layer on a side of the first barrier dam away from the base substrate, the first barrier dam at least partially surrounds the opening region, the insulating protection layer comprises at least one first material removal region, and a projection of the first material removal region on the base substrate is overlapped with a projection of the first barrier dam on the base substrate; in the at least one first material removal region, a material of the insulating protection layer is at least partially removed, to form a recess portion in the insulating protection layer or a through hole penetrating the insulating protection layer.

For example, in the display substrate provided by at least one embodiment of the present disclosure, the insulating protection layer further comprises an opening in the opening region.

For example, in the display substrate provided by at least one embodiment of the present disclosure, the at least one first material removal region comprises a plurality of first material removal regions spaced from each other along an extension direction of the first barrier dam.

For example, in the display substrate provided by at least one embodiment of the present disclosure, the first barrier dam has a first bottom surface close to the base substrate, in a direction parallel to a surface of the base substrate and perpendicular to the extension direction of the first barrier dam, a width of each of the plurality of first material removal regions is less than a width of the first bottom surface.

For example, in the display substrate provided by at least one embodiment of the present disclosure, a ratio of the width of each of the plurality of first material removal regions to the width of the first bottom surface ranges from 0.3 to 0.7.

For example, in the display substrate provided by at least one embodiment of the present disclosure, the width of each of the plurality of first material removal regions ranges from 15 μm to 25 μm; a length of each of the plurality of first material removal regions in the extension direction of the first barrier dam ranges from 8 μm to 12 μm; and an interval between two adjacent first material removal regions in the extension direction of the first barrier dam ranges from 3 μm to 7 μm.

For example, in the display substrate provided by at least one embodiment of the present disclosure, the opening peripheral region further comprises a second barrier dam on the base substrate, the second barrier dam at least partially surrounds the opening region and is on a side of the first barrier dam close to the opening region, the insulating protection layer is further on a side of the second barrier dam away from the base substrate; the insulating protection layer comprises at least one second material removal region, and a projection of the second material removal region on the base substrate is overlapped with a projection of the second barrier dam on the base substrate; in the at least one second material removal region, a material of the insulating protection layer is at least partially removed, to form a recess portion in the insulating protection layer or a through hole penetrating the insulating protection layer.

For example, in the display substrate provided by at least one embodiment of the present disclosure, the at least one second material removal region comprises a plurality of second material removal regions spaced from each other along an extension direction of the second barrier dam.

For example, in the display substrate provided by at least one embodiment of the present disclosure, the second barrier dam has a second bottom surface close to the base substrate, in a direction parallel to a surface of the base substrate and perpendicular to the extension direction of the second barrier dam, a width of each of the plurality of second material removal regions is less than a width of the second bottom surface.

For example, in the display substrate provided by at least one embodiment of the present disclosure, a ratio of the width of each of the plurality of second material removal regions to the width of the second bottom surface ranges from 0.3 to 0.7.

For example, in the display substrate provided by at least one embodiment of the present disclosure, the width of each of the plurality of second material removal regions ranges from 8 μm to 12 μm; a length of each of the plurality of second material removal regions in the extension direction of the second barrier dam ranges from 8 μm to 12 μm; and an interval between two adjacent second material removal regions in the extension direction of the second barrier dam ranges from 3 μm to 7 μm.

For example, in the display substrate provided by at least one embodiment of the present disclosure, the insulating protection layer further comprises a third material removal region extending between the first barrier dam and the second barrier dam, in the third material removal region, a material of the insulating protection layer is at least partially removed, to form a recess portion in the insulating protection layer or a through hole penetrating the insulating protection layer.

For example, in the display substrate provided by at least one embodiment of the present disclosure, the insulating protection layer further comprises a fourth material removal region at an edge of the opening peripheral region close to the opening region, in the fourth material removal region, a material of the insulating protection layer is at least partially removed, to form a recess portion in the insulating protection layer or a through hole penetrating the insulating protection layer, and the fourth material removal region is communicated with the opening region.

For example, in the display substrate provided by at least one embodiment of the present disclosure, the display region has a plurality of sub-pixels arranged in an array, and comprises a driving circuit layer, a planarization layer and a pixel definition layer sequentially arranged on the base substrate, the pixel definition layer comprises a plurality of sub-pixel openings, each of the plurality of sub-pixels comprises a light-emitting member at least partially disposed in one of the plurality of sub-pixel openings and a pixel driving circuit disposed in the driving circuit layer and configured to drive the light-emitting member; the first barrier dam is in a same layer with at least one of the planarization layer and the pixel definition layer.

For example, in the display substrate provided by at least one embodiment of the present disclosure, the second barrier dam comprises a first barrier layer and a second barrier layer that are stacked, the first barrier layer is in a same layer with the planarization layer, and the second barrier layer is in a same layer with the pixel definition layer.

For example, in the display substrate provided by at least one embodiment of the present disclosure, light-emitting members of the plurality of sub-pixels comprise a light-emitting material layer in the plurality of sub-pixel openings, the light-emitting material layer further extends to the opening peripheral region and to sides of the first barrier dam and the second barrier dam away from the base substrate, and the insulating protection layer is on a side of the light-emitting material layer away from the base substrate.

For example, in the display substrate provided by at least one embodiment of the present disclosure, the display region and the opening peripheral region further comprise an encapsulation layer on a side of the light-emitting material layer away from the base substrate and a touch layer on a side of the encapsulation layer away from the base substrate, the insulating protection layer is on a side of the touch layer away from the base substrate, and the touch layer comprises a first touch layer, a second touch layer and a touch insulation layer between the first touch layer and the second touch layer, the at least one first material removal region of the insulating protection layer exposes the touch insulation layer and/or the second touch layer.

For example, in the display substrate provided by at least one embodiment of the present disclosure, the opening peripheral region further comprises a detection line, the detection line at least partially surrounds the opening region, and in a direction perpendicular to the surface of the base substrate, the detection line is not overlapped with the at least one first material removal region.

For example, in the display substrate provided by at least one embodiment of the present disclosure, the detection line is in a same layer with the first touch layer and/or the second touch layer.

For example, in the display substrate provided by at least one embodiment of the present disclosure, a material of the insulating protection layer comprises polyimide.

At least one embodiment of the present disclosure provides a display device, the display device comprises the display substrate provided by an embodiment of the present disclosure.

For example, the display device provided by at least one embodiment of the present disclosure further comprises a light sensing member, the display substrate has a display side and a non-display side, the light sensing member is on the non-display side, and in a direction perpendicular to a surface of the base substrate, the light sensing member is at least partially overlapped with the opening region.

At least one embodiment of the present disclosure provides a manufacturing method of a display substrate, the manufacturing method comprises forming an opening forming region, a display region at least partially surrounding the opening forming region, and an opening peripheral region between the opening forming region and the display region, the manufacturing method further comprises: providing a base substrate, in the opening peripheral region, forming a first barrier dam on the base substrate and forming an insulating protection layer on a side of the first barrier dam away from the base substrate, the first barrier dam at least partially surrounds the opening forming region, the insulating protection layer comprises at least one first material removal region, and a projection of the first material removal region on the base substrate is overlapped with a projection of the first barrier dam on the base substrate; and at least partially removing a material of the insulating protection layer in the at least one first material removal region, to form a recess portion in the insulating protection layer or a through hole penetrating the insulating protection layer.

For example, in the manufacturing method provided by at least one embodiment of the present disclosure, the opening peripheral region comprises an opening cutting region on a side of the opening peripheral region close to the opening forming region, and the opening cutting region at least partially surrounds the opening forming region, the insulating protection layer comprises a fifth material removal region in the opening cutting region, and the manufacturing method further comprises: at least partially removing a material of the insulating protection layer in the fifth material removal region, to form a recess portion in the insulating protection layer or a through hole penetrating the insulating protection layer.

For example, in the manufacturing method provided by at least one embodiment of the present disclosure, in a direction perpendicular to an extension direction of the opening cutting region, a width of the opening cutting region ranges from 350 μm to 450 μm.

For example, in the manufacturing method provided by at least one embodiment of the present disclosure, the fifth material removal region at least partially surrounds the opening forming region, and in a direction perpendicular to an extension direction of the fifth material removal region, a width of the fifth material removal region ranges from 150 μm to 250 μm, and a distance between the fifth material removal region and an edge of the opening cutting region ranges from 50 μm to 150 μm.

For example, the manufacturing method provided by at least one embodiment of the present disclosure further comprises: determining a cutting line at least partially surrounding the opening forming region in the opening cutting region, and cutting the display substrate along the cutting line, to separate the opening forming region from the display substrate to form an opening region.

BRIEF DESCRIPTION OF THE DRAWINGS

In order to clearly illustrate the technical solutions of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1:
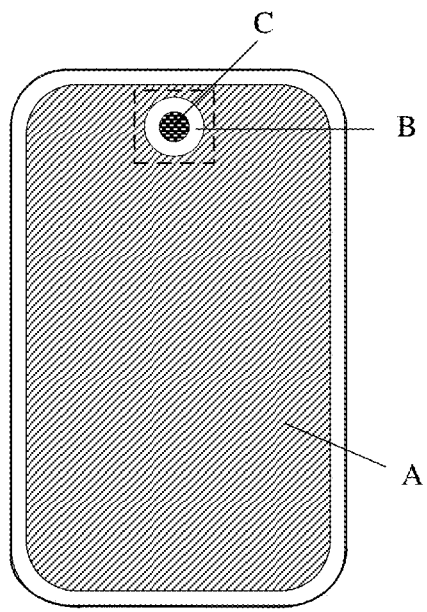
FIG. 1 is a planar diagram of a display substrate provided by at least one embodiment of the present disclosure.

In order to make objects, technical details and advantages of embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In a manufacturing process of a flexible display panel, a flexible substrate of the flexible display panel is usually formed on a rigid substrate, and then functional structures of the display panel such as a driving circuit and a light-emitting member are formed on the flexible substrate. After the manufacturing of these functional structures is completed, the flexible substrate is separated from the rigid substrate, to form the flexible display panel.

A process of separating the flexible substrate from the rigid substrate usually includes a laser stripping process, that is, using a laser with a certain energy to irradiate the rigid substrate to weaken the adhesion of the flexible substrate on the rigid substrate, and then separating the flexible substrate from the rigid substrate. The inventor(s) of the present disclosure found that in the process of irradiating the rigid substrate with the laser with a certain energy, the energy will also be transmitted to the functional structures on the flexible substrate, and some materials in the functional structures (such as some organic insulating materials) will expand by heating, so the phenomenon of stripping off between the film layers will occur. For example, in some examples, a peripheral region of the display panel has barrier structures such as a barrier dam, the barrier structures are generally formed of an organic insulating material. In addition, the light-emitting material layer on the display panel is usually formed on the whole surface of the display panel, and therefore the light-emitting material layer will extend to an upper side of the barrier dam. When the flexible substrate is separated from the rigid substrate by the laser stripping process, the energy of the laser will be transmitted to the barrier dam, making the barrier dam expand by heating, resulting in the separation of the barrier dam and the light-emitting material layer, damaging the structure of the display panel and reducing the production yield of the display panel.

For this situation, through experiments, if the energy density of the laser used in the laser stripping process is reduced, the phenomenon that the flexible substrate cannot be completely stripped from the rigid substrate may occur. Therefore, the film stripping problem of the display panel caused by the laser stripping process may not be effectively solved only by changing the process conditions.

At least one embodiment of the present disclosure provides a display substrate, the display substrate has an opening region, a display region at least partially surrounding the opening region, and an opening peripheral region between the opening region and the display region, and includes a base substrate, the opening peripheral region includes a first barrier dam on the base substrate and an insulating protection layer on a side of the first barrier dam away from the base substrate, the insulating protection layer includes at least one first material removal region, and a projection of the first material removal region on the base substrate is overlapped with a projection of the first barrier dam on the base substrate; in the at least one first material removal region, a material of the insulating protection layer is at least partially removed to form a recess portion in the insulating protection layer or a through hole penetrating the insulating protection layer.

In the above display substrate provided by at least one embodiment of the present disclosure, the insulating protection layer above the first barrier dam has the first material removal region corresponding to the first barrier dam, and therefore during the manufacturing process, the energy generated by the first barrier dam due to heating (for example, laser irradiation) can be dissipated through the first material removal region of the insulating protection layer, thereby weakening or eliminating the possible thermal expansion phenomenon of the first barrier dam, avoiding the film stripping phenomenon, ensuring the integrity of the display substrate, and improving the manufacturing yield of the display substrate.

In the following, the display substrate and the manufacturing method thereof, and the display device provided by some embodiments of the present disclosure are described below through several specific embodiments.

At least one embodiment of the present disclosure provides a display substrate. FIG. 1 shows a planar diagram of the display substrate, FIG. 2 shows an enlarged diagram of the display substrate in FIG. 1 in a dotted frame, FIG. 3 shows a cross-sectional diagram of the display panel in FIG. 2 along a line M-M; and FIG. 4 shows another cross-sectional diagram of the display panel in FIG. 2 along the line M-M.

As shown in FIGS. 1-4, the display substrate has an opening region C, a display region at least partially surrounding (shown as completely surrounding in the Figures) the opening region C, and an opening peripheral region B between the opening region C and the display region A, and includes a base substrate 1011.

For example, the opening region C may be in a circular shape, an elliptical shape, a square shape, a rectangular shape or some irregular shapes. The embodiments of the present disclosure do not limit the specific shape of the opening region C. The opening region C may be reserved for the arrangement of a light sensing member, such as a camera, an infrared sensor, etc. In addition, although it is shown in FIG. 1 that the display region A completely surrounds the opening region C, in other embodiments, the display region A may also partially surrounds the opening region C.

Figure 2:
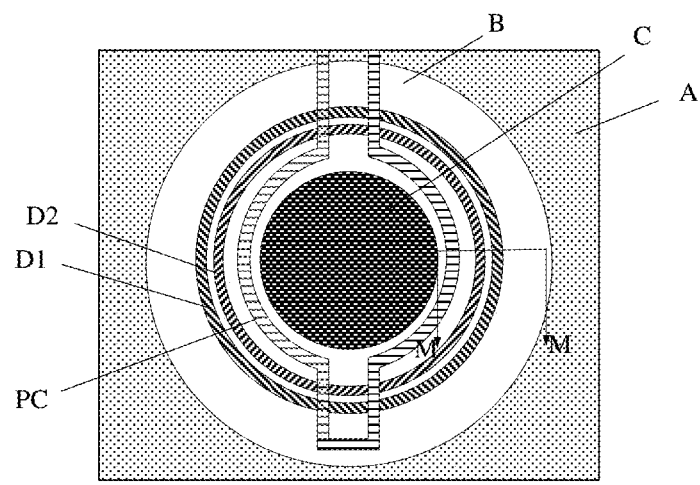
FIG. 2 is an enlarged diagram of the display substrate in FIG. 1 in a dotted frame.
Figure 3:
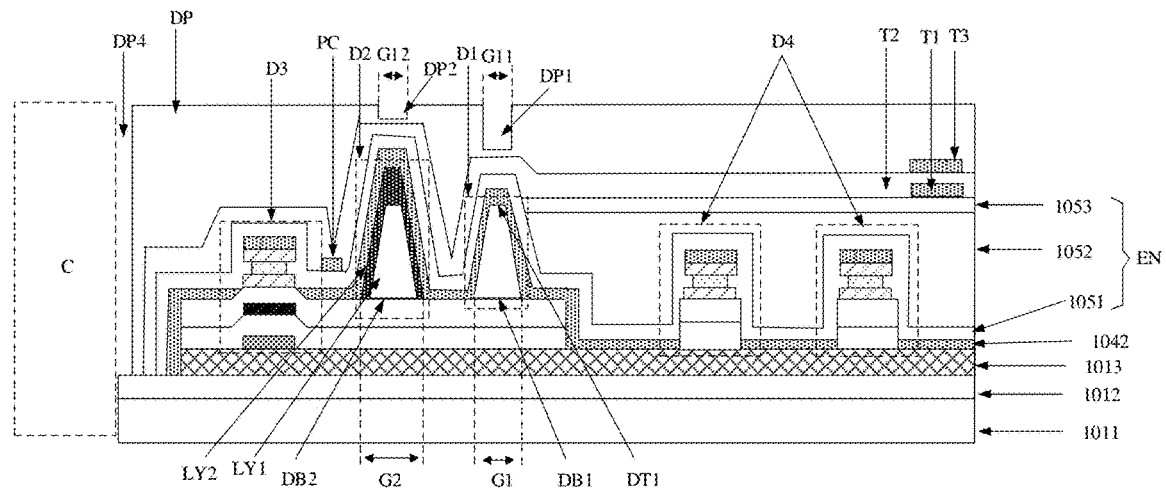
FIG. 3 is a cross-sectional diagram of the display substrate in FIG. 2 along a line M-M.
Figure 4:
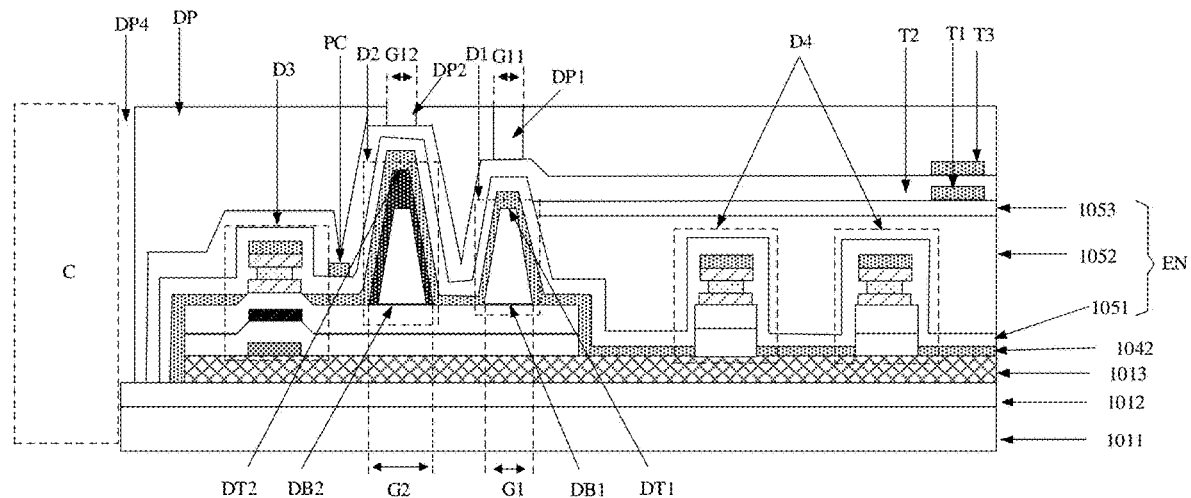
FIG. 4 is another cross-sectional diagram of the display substrate in FIG. 2 along the line M-M.

For example, as shown in FIGS. 2-4, the opening peripheral region B includes a first barrier dam D1 on the base substrate 1011 and an insulating protection layer DP on a side of the first barrier dam D1 away from the base substrate 1011, and the first barrier dam D1 at least partially surrounds (for example, completely surrounds) the opening region C. As shown in FIG. 3 and FIG. 4, the insulating protection layer DP includes at least one first material removal region DP1. A projection of the first material removal region DP1 on the base substrate 1011 is overlapped with a projection of the first barrier dam D1 on the base substrate 1011. For example, the projection of the first material removal region DP1 on the base substrate 1011 is located within the projection of the first barrier dam D1 on the base substrate 1011; that is, in a direction perpendicular to a surface of the base substrate 1011, that is, in the vertical direction in the figure, the insulating protection layer DP includes a first portion overlapping the first barrier dam D1, that is, a portion within a width G1 in the figure, and the first portion includes at least one first material removal region DP1; in the at least one first material removal region DP1, a material of the insulating protection layer DP is at least partially removed to form a recess portion in the insulating protection layer DP (i.e., a case shown in FIG. 3) or a through hole penetrating the insulating protection layer DP (i.e., a case shown in FIG. 4).

In the display substrate provided by at least one embodiment of the present disclosure, the insulating protection layer on the first barrier dam has the first material removal region corresponding to the first barrier dam. Therefore, during the manufacturing process, the energy generated by the first barrier dam due to heating (for example, laser irradiation) can be dissipated through the first material removal region of the insulating protection layer, thereby weakening or eliminating the possible thermal expansion phenomenon of the first barrier dam, avoiding the film stripping phenomenon, ensuring the integrity of the display substrate, and improving the manufacturing yield of the display substrate.

For example, the insulating protection layer DP further includes an opening located in the opening region C. For example, in some embodiments, a shape of the opening, in the opening region C, included in the insulating protection layer DP is substantially the same as the shape of the opening region C, and the size of the opening, in the opening region C, included in the insulating protection layer DP is slightly larger than the size of the opening region C.

Figure 5:
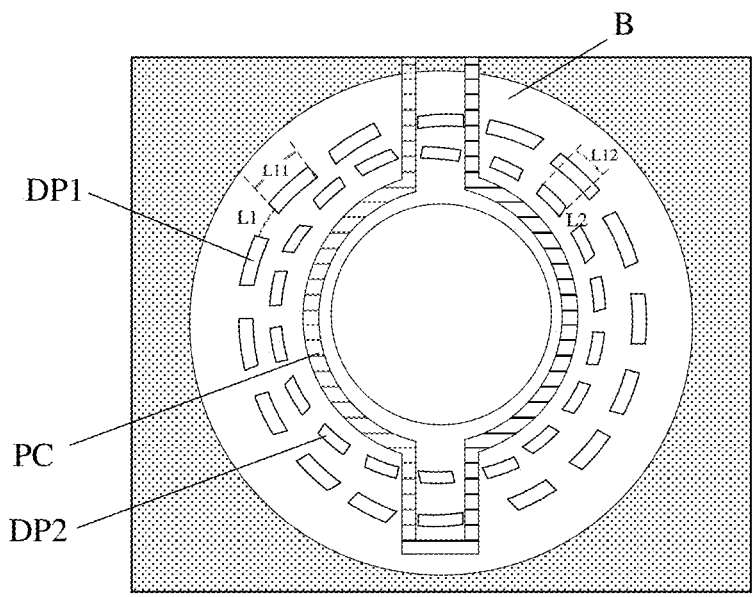
FIG. 5 is another enlarged diagram of the display substrate in FIG. 1 in the dotted frame.

For example, in some embodiments, as shown in FIG. 5, the at least one first material removal region DP1 includes a plurality of first material removal regions DP1 arranged at intervals along an extension direction of the first barrier dam D1.

For example, as shown in FIG. 3 and FIG. 4, the first barrier dam D1 has a first bottom surface DB1 close to the base substrate 1011, and in a direction parallel to the surface of the base substrate 1011 and perpendicular to the extension direction of the first barrier dam D1, a width G11 of each first material removal region DP1 is less than the width G1 of the first bottom surface DB1. For example, the first barrier dam D1 also has a first top surface DT1 opposite to the first bottom surface DB1. For example, in some examples, the width G11 of each first material removal region DP1 is greater than or equal to the width DT1 of the first top surface.

It should be noted that, in the embodiments of the present disclosure, the first barrier dam D1 extends in an arc shape as a whole, so the extension direction of the first barrier dam D1 is a curve. In this case, the extension direction refers to a tangent direction of each position of the first barrier dam D1, and the direction perpendicular to the extension direction refers to a direction perpendicular to the tangent of each position of the first barrier dam DE The terms "extension direction" and "perpendicular to the extension direction" described later have the same interpretation and will not be repeated later.

For example, in some examples, a ratio of the width G11 of each first material removal region DP1 to the width of the first bottom surface DB1 ranges from 0.3 to 0.7, such as 0.4, 0.5, 0.6, etc. For example, an orthographic projection of each first material removal region DP1 on the first bottom surface DB1 of the first barrier dam D1 is located in a middle position of the first bottom surface DB1. For example, in FIG. 3 and FIG. 4, left and right boundaries of the orthographic projection of each first material removal region DP1 on the first bottom surface DB1 of the first barrier dam D1 have the same distance from left and right boundaries of the first bottom surface DB1.

For example, in some examples, as shown in FIGS. 3-5, the width G11 of each first material removal region DP1 ranges from 15 μm to 25 μm, for example, 18 μm, 20 μm or 22 μm, etc. A length L11 of each first material removal region DP1 in the extension direction of the first barrier dam D1 ranges from 8 μm to 12 μm, for example, 9 μm, 10 μm or 11 μm, etc. An interval L1 between two adjacent first material removal regions DP1 in the extension direction of the first barrier dam D1 ranges from 3 μm to 7 μm, for example, 4 μm, 5 μm or 6 μm, etc. Experiments show that under the above configuration of the first material removal region DP1, the first material removal region DP1 can effectively dissipate the energy generated by the heating of the first barrier dam D1 during the manufacturing process of the display substrate, so as to effectively avoid the film stripping phenomenon.

For example, in some embodiments, as shown in FIGS. 2-4, the opening peripheral region B may further include a second barrier dam D2 arranged on the base substrate 1011, the second barrier dam D2 at least partially surrounds (for example, completely surrounds) the opening region C and is arranged on a side of the first barrier dam D1 close to the opening region C, the insulating protection layer DP is further arranged on a side of the second barrier dam D2 away from the base substrate 1011. For example, the insulating protection layer DP includes at least one second material removal region DP2, a projection of the second material removal region DP2 on the base substrate 1011 is overlapped with a projection of the second barrier dam D2 on the base substrate 1011. For example, the projection of the second material removal region DP2 on the base substrate 1011 is located within the projection of the second barrier dam D2 on the base substrate 1011; that is, in the direction perpendicular to the surface of the base substrate 1011, as shown in FIG. 3 and FIG. 4, the insulating protection layer DP has a second portion overlapping the second barrier dam D2, that is, the portion within a width G2 in the figure, and the second portion includes at least one second material removal region DP2; in the at least one second material removal region DP2, the material of the insulating protection layer DP2 is at least partially removed to form a recess portion in the insulating protection layer DP (i.e., the case shown in FIG. 3) or a through hole penetrating the insulating protection layer (i.e., the case shown in FIG. 4).

In the display substrate provided by at least one embodiment of the present disclosure, the insulating protection layer on the second barrier dam has the second material removal region corresponding to the second barrier dam. Therefore, during the manufacturing process, the energy generated by the second barrier dam due to heating (for example, laser irradiation) can be dissipated through the second material removal region of the insulating protection layer, thereby weakening or eliminating the possible thermal expansion phenomenon of the second barrier dam, avoiding the film stripping phenomenon, ensuring the integrity of the display substrate, and improving the manufacturing yield of the display substrate.

For example, in some embodiments, as shown in FIG. 5, the at least one second material removal region DP2 includes a plurality of second material removal regions DP2 arranged at intervals along the extension direction of the second barrier dam D2.

For example, as shown in FIG. 3 and FIG. 4, the second barrier dam D2 has a second bottom surface DB2 close to the base substrate 1011, and in the direction parallel to the surface of the substrate 1011 and perpendicular to the extension direction of the second barrier dam D2, a width G12 of each second material removal region DP2 is less than a width G2 of the second bottom surface DB2. For example, the second barrier dam D2 also has a second top surface DT2 opposite to the second bottom surface DB2. For example, in some examples, the width G12 of each second material removal region DP2 is greater than or equal to a width DT2 of the second top surface.

For example, in some examples, a ratio of the width G12 of each second material removal region DP2 to the width G2 of the second bottom surface DS2 ranges from 0.3 to 0.7, such as 0.4, 0.5, 0.6, etc. For example, an orthographic projection of each second material removal region DP2 on the second bottom surface DB2 of the second barrier dam D2 is located in a middle position of the second bottom surface DB2. For example, in FIG. 3 and FIG. 4, left and right boundaries of the orthographic projection of each second material removal region DP2 on the second bottom surface DB2 of the second barrier dam D2 have the same distance from left and right boundaries of the second bottom surface DB2.

For example, in some examples, as shown in FIGS. 3-5, the width G12 of each second material removal region DP2 ranges from 8 μm to 12 μm, for example, 9 μm, 10 μm or 11 μm, etc. A length L12 of each second material removal region DP2 in the extension direction of the second barrier dam D2 ranges from 8 μm to 12 μm, for example, 9 μm, 10 μm or 11 μm, etc. An interval L2 between two adjacent second material removal regions DP2 in the extension direction of the second barrier dam D2 ranges from 3 μm to 7 μm, for example, 4 μm, 5 μm or 6 μm, etc. Experiments show that under the above configuration of the second material removal region DP2, the second material removal region DP2 can effectively dissipate the energy generated by the heating of the second barrier dam D2 during the manufacturing process of the display substrate, so as to effectively avoid the film stripping phenomenon.

For example, as shown in FIG. 3 and FIG. 4, a depth of material removal in the first material removal region DP1 and a depth of material removal of the second material removal region DP2 may be the same or different (the case shown in the figure), which is not specifically limited by the embodiments of the present disclosure.

For example, in some embodiments, the display substrate further has more barrier dams with similar structure and function to the first barrier dam D1 and the second barrier dam D2. The insulating protection layer on these barrier dams may also adopt the same or similar design as the insulating protection layer on the first barrier dam D1 and the second barrier dam D2, which will not be repeated here.

Figure 6:
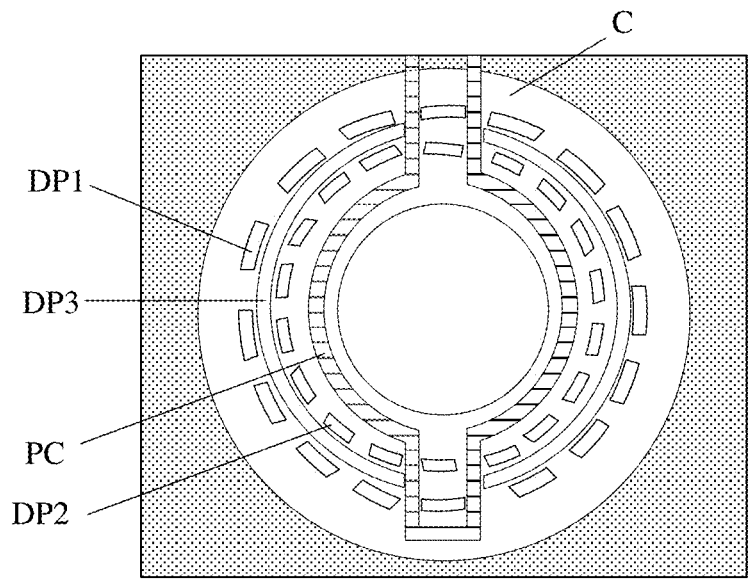
FIG. 6 is further another enlarged diagram of the display substrate in FIG. 1 in the dotted frame.
Figure 7:
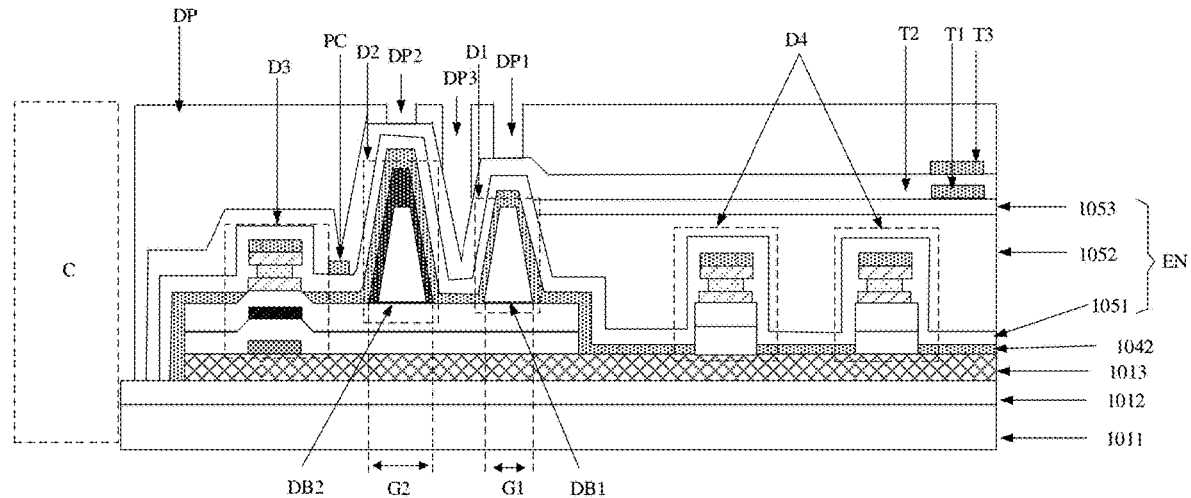
FIG. 7 is another cross-sectional diagram of the display substrate in FIG. 2 along the line M-M.
Figure 8:
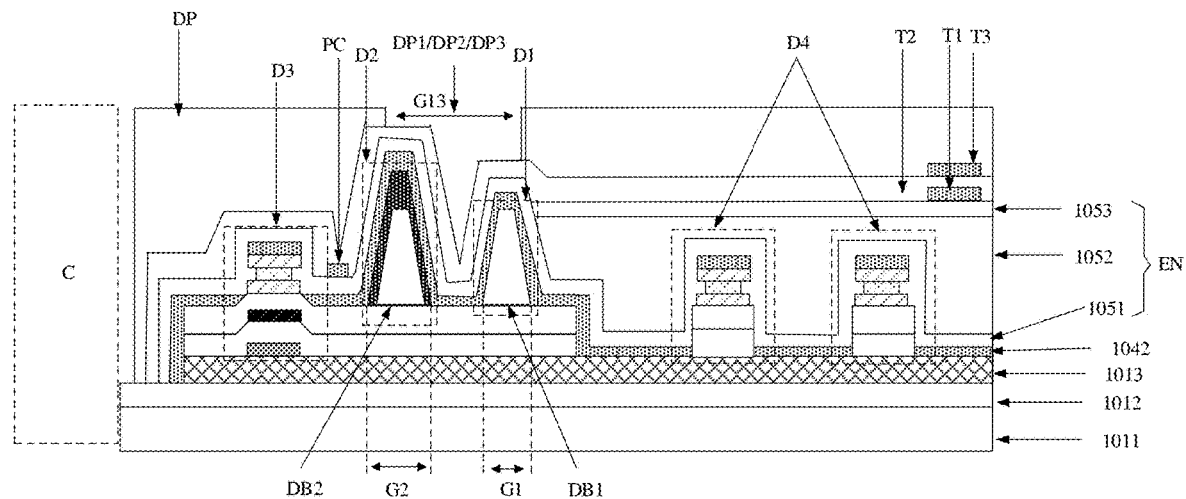
FIG. 8 is further another cross-sectional diagram of the display substrate in FIG. 2 along the line M-M.

For example, in some embodiments, as shown in FIG. 6 and FIG. 7, the insulating protection layer DP may further include a third material removal region DP3 extending between the first barrier dam D1 and the second barrier dam D2. In the third material removal region DP3, a material of the insulating protection layer DP is at least partially removed to form a recess portion in the insulating protection layer DP or a through hole penetrating the insulating protection layer DP. For example, as shown in FIG. 6 and FIG. 7, the first material removal region DP1, the second material removal region DP2 and the third material removal region DP3 may be arranged at intervals, or in other embodiments, as shown in FIG. 8, the first material removal region DP1, the second material removal region DP2 and the third material removal region DP3 may also be communicated with each other to form a material removal region with a large area. For example, a width G13 of the entirety of the first material removal region DP1, the second material removal region DP2 and the third material removal region DP3 communicated with each other ranges from 75 μm to 95 μm, for example, 78 μm, 80 μm, 85 μm, 88 μm or 90 μm, etc.

For example, in some examples, as shown in FIG. 8, a distance between a right boundary of the entirety of the first material removal region DP1, the second material removal region DP2 and the third material removal region DP3 communicated with each other and a right boundary of the first bottom surface DB1 of the first barrier dam D1 ranges from 3 μm to 7 μm, for example, 5 μm. A distance between a left boundary of the entirety of the first material removal region DP1, the second material removal region DP2 and the third material removal region DP3 communicated with each other and a left boundary of the second bottom surface DB2 of the second barrier dam D2 ranges from 2 μm to 4 μm, for example, 3 μm.

In the display substrate provided by at least one embodiment of the present disclosure, the insulating protection layer further has the third material removal region located between the first barrier dam and the second barrier dam. Therefore, during the manufacturing process, the energy generated by the first barrier dam and the second barrier dam due to heating (for example, laser irradiation) can be further dissipated through the third material removal region of the insulating protection layer, thereby further weakening or eliminating the possible thermal expansion phenomenon of the first barrier dam and the second barrier dam, avoiding the film stripping phenomenon, ensuring the integrity of the display substrate, and improving the manufacture yield of the display substrate.

Figure 9:
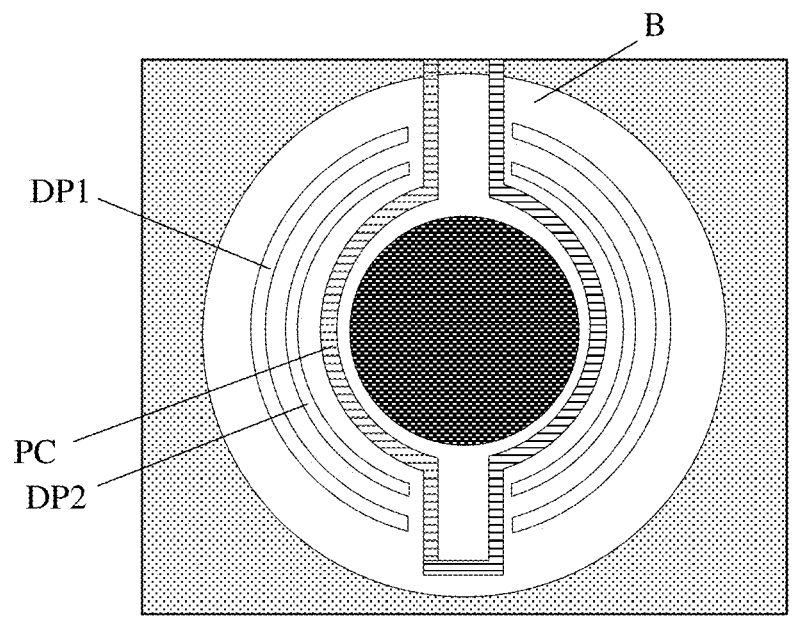
FIG. 9 is further another enlarged diagram of the display substrate in FIG. 1 in the dotted frame.

For example, in other embodiments, the first material removal region DP1 and the second material removal region DP2 may also adopt different configurations. For example, FIG. 9 shows another enlarged diagram of the display substrate in FIG. 1 in the dotted frame. In the example shown in FIG. 9, the insulating protection layer DP has two first material removal regions DP1 and two second material removal regions DP2. Distances from the first material removal region DP1 and the second material removal region DP2 to a detection line PC (described later) range from 40 μm to 60 μm, for example, 45 μm, 50 μm or 60 μm, etc. For example, in this example, the insulating protection layer DP may also include a third material removal region DP3 extending between the first barrier dam D1 and the second barrier dam D2. The specific arrangement of the third material removal region DP3 may refer to the above example and will not be repeated again.

Figure 10:
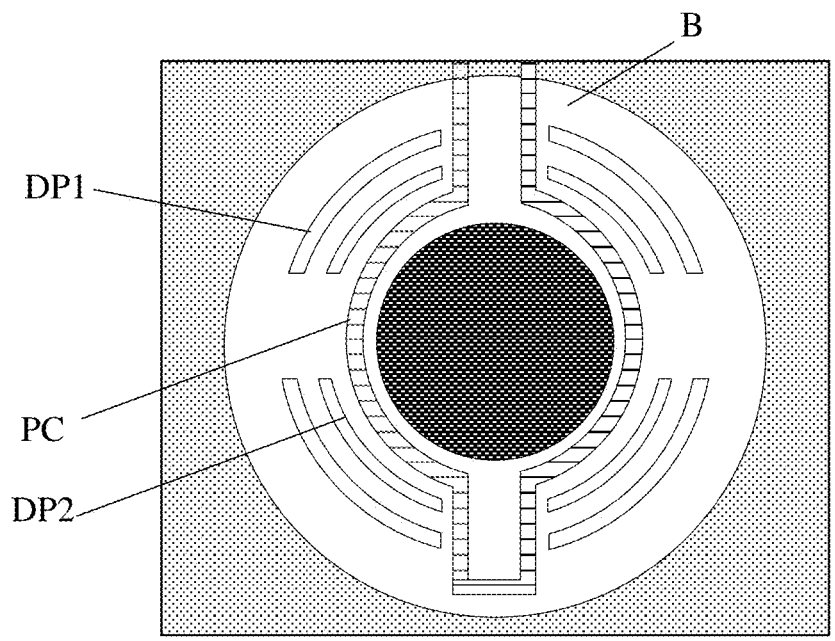
FIG. 10 is further another enlarged diagram of the display substrate in FIG. 1 in the dotted frame.

For example, FIG. 10 shows another enlarged diagram of the display substrate in FIG. 1 in the dotted frame. In the example shown in FIG. 10, the insulating protection layer DP has four first material removal regions DP1 and four second material removal regions DP2, for example, the four first material removal regions DP1 and the four second material removal regions DP2 are uniformly distributed along the opening region C. For example, distances from the first material removal region DP1 and the second material removal region DP2 to the detection line PC (described later) range from 40 μm to 60 μm, such as 45 μm, 50 μm or 60 μm, etc. For example, a distance between adjacent first material removal region DP1 and second material removal region DP2 also ranges from 40 μm to 60 μm, such as 45 μm, 50 μm, or 60 μm. For example, in this example, the insulating protection layer DP may further include a third material removal region DP3 extending between the first barrier dam D1 and the second barrier dam D2, and the specific arrangement of the third material removal region DP3 may refer to the above example and will not be repeated again.

For example, in some embodiments, as shown in FIG. 3 and FIG. 4, the insulating protection layer DP may further include a fourth material removal region DP4 at an edge of the opening peripheral region B close to the opening region C, in the fourth material removal region DP4, the material of the insulating protection layer DP is at least partially removed to form a recess portion in the insulating protection layer DP or a through hole penetrating the insulating protection layer DP, the figure shows a case that the through hole is formed in the insulating protection layer DP. For example, the fourth material removal region DP4 is communicated with the opening region C.

In the display substrate provided by at least one embodiment of the present disclosure, the insulating protection layer further has the fourth material removal region close to the opening region C. Therefore, during the manufacturing process, the energy generated by the heating (for example, laser irradiation) of the first barrier dam, the second barrier dam and an organic insulating material near the fourth material removal region can be further dissipated through the fourth material removal region of the insulating protection layer, thereby further weakening or eliminating the possible thermal expansion phenomenon of the organic insulating material in the display substrate, avoiding the film stripping phenomenon, ensuring the integrity of the display substrate, and improving the manufacturing yield of the display substrate.

Figure 11:
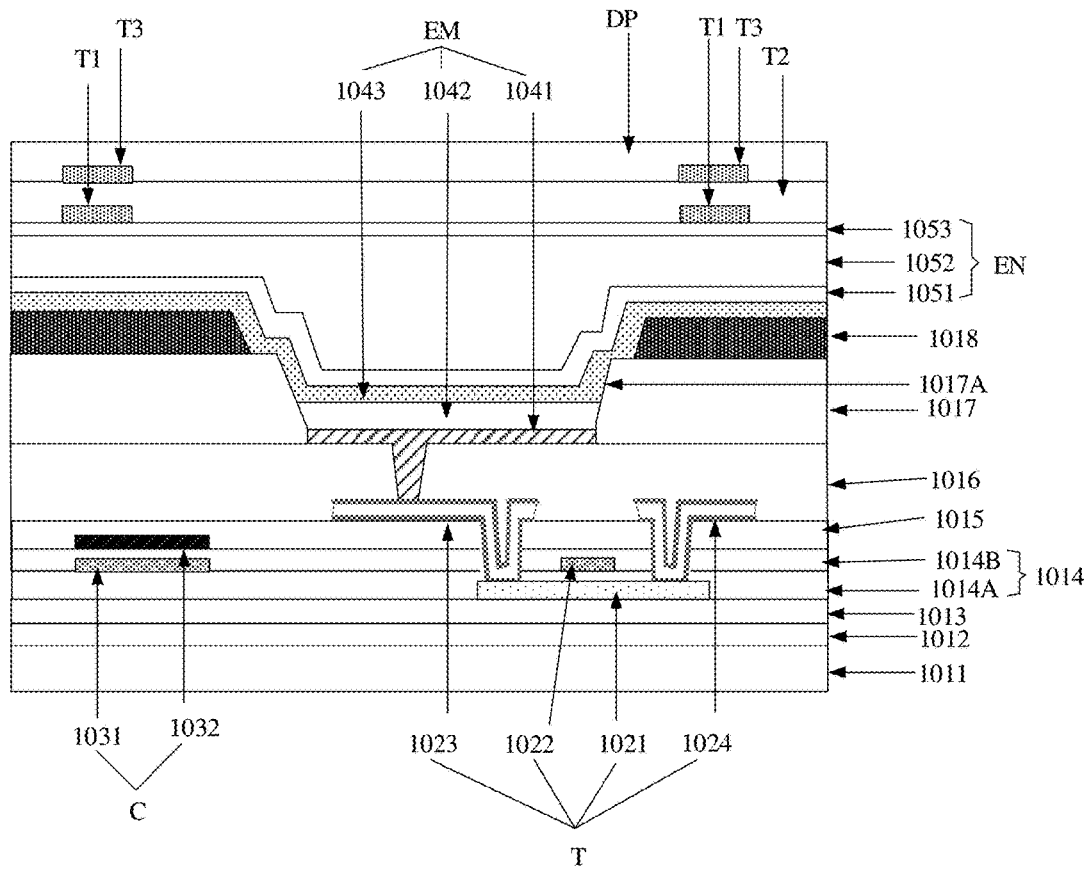
FIG. 11 is a cross-sectional diagram of a sub-pixel in a display substrate provided by at least one embodiment of the present disclosure.

For example, the display region A has a plurality of sub-pixels arranged in an array for displaying. For example, FIG. 11 shows a cross-sectional diagram of one sub-pixel in the display region. As shown in FIG. 11, in some embodiments, the display region A has a base substrate 1011 and includes a driving circuit layer, a planarization layer 1016, and a pixel definition layer 1017 sequentially arranged on the base substrate 1011, the planarizing layer 1016 is configured to planarize the pixel driving circuit, and the pixel definition layer 1017 includes a plurality of sub-pixel openings 1017A for defining light-emitting regions of the plurality of sub-pixels, each sub-pixel includes a light-emitting member EM at least partially disposed in the sub-pixel opening 1017A and a pixel driving circuit disposed in the driver circuit layer and configured to drive the light-emitting member.

For example, as shown in FIG. 11, the pixel driving circuit includes structures such as a thin film transistor T, a storage capacitor C, and the like. The thin film transistor T includes an active layer 1021, a gate electrode 1022, a gate insulation layer 1014 (for example, including a first gate insulation 1014A and a second gate insulation layer 1014B), an interlayer insulation layer 1015 and source and drain electrodes (including a source electrode 1023 and a drain electrode 1024). The storage capacitor C includes a first plate 1031 and a second plate 1032. For example, the first plate 1031 and the gate electrode 1022 are in the same layer, and the second plate 1032 is between the gate insulation layer 1014 and the interlayer insulation layer 1015.

It should be noted that, in the embodiments of the present disclosure, the arrangement of two structural layers or functional layers in the same layer means that the two structural layers or functional layers maybe be formed by using the same material layer and the same manufacturing process (such as a patterning process, etc.). Therefore, the manufacturing process of the display substrate can be simplified.

For example, the pixel driving circuit may be formed into a 2T1C (two thin film transistors and one storage capacitor), 6T1C (six thin film transistors and one storage capacitor), etc., so that the pixel driving circuit includes a plurality of thin film transistors, and the plurality of thin film transistors have a structure similar to or the same as the stacked structure shown in FIG. 11. FIG. 11 only shows the thin film transistor directly connected to the light-emitting member, and the thin film transistor may be a driving thin film transistor, a light-emission control thin film transistor, or the like.

For example, the light-emitting member EM includes an anode layer 1041, a light-emitting material layer 1042 and a cathode layer 1043. The anode layer 1041 is connected to the source electrode 1023 of the thin film transistor T through a through hole in the planarization layer 1016. For example, in some examples, an auxiliary light-emitting material layer (not shown in the figure) that helps the light-emitting material layer 1042 to emit light is provided between the anode layer 1041 and the light-emitting material layer 1042 and between the cathode layer 1043 and the light-emitting material layer 1042, for example, the auxiliary light-emitting material layer includes one or more of an electron transport layer, an electron injection layer, a hole transport layer, and a hole injection layer, which are not shown in the figures.

For example, as shown in FIG. 11, the display substrate further includes a spacer 1018 and an encapsulation layer EN. The encapsulation layer EN is a composite encapsulation layer, which includes a first inorganic encapsulation layer 1051, a first organic encapsulation layer 1052 and a second inorganic encapsulation layer 1053 that are stacked in sequence. For example, the first inorganic encapsulation layer 1051 and the second inorganic encapsulation layer 1053 may be formed of an inorganic material such as silicon nitride, silicon oxide, silicon oxynitride, or the like, and the first organic encapsulation layer 1052 may be formed of an organic material such as polyimide (PI), epoxy resin, or the like. The composite encapsulation layer can form multiple protections for the functional structures on the display panel, and has better encapsulation effect.

For example, as shown in FIG. 11, the display substrate may further include a barrier layer 1012 and a buffer layer 1013 disposed on the base substrate 1011. The barrier layer 1012 can prevent impurities such as water and oxygen from infiltrating to functional structures such as the thin film transistor 102 and the like from the base substrate 1011. The buffer layer 1013 can provide a flat surface to facilitate the arrangement of other functional layers of the display substrate. The barrier layer 1012 and the buffer layer 1013 can jointly protect other functional structures on the base substrate 1011.

For example, in some embodiments, the first barrier dam D1 is in the same layer as at least one of the planarization layer 1016 and the pixel definition layer 1017. For example, in some examples, the first barrier dam D1 may be disposed in the same layer as the planarization layer 1016; in other examples, the first barrier dam D1 may also be disposed in the same layer as the pixel definition layer 1017, thereby simplifying the manufacturing process of the display substrate.

For example, in some embodiments, as shown in FIG. 3, the second barrier dam D2 includes a first barrier layer LY1 and a second barrier layer LY2 that are stacked, the first barrier layer LY1 is disposed in the same layer as the planarization layer 1016, and the second barrier layer LY2 is disposed in the same layer as the pixel definition layer 1017, thereby simplifying the manufacturing process of the display substrate.

For example, in some embodiments, as shown in FIG. 3, FIG. 4, FIG. 7 and FIG. 8, the opening peripheral region B may further include a third barrier dam D3 on a side of the second barrier dam D2 close to the opening region C. The third barrier dam D3 is, for example, a crack barrier dam. For example, in the manufacturing process of the display substrate, in a case that the opening region C is formed by cutting, punching, etc., the third barrier dam D3 can prevent cracks from occurring at the cutting position or prevent the cracks from extending to the display region A. For example, the third barrier dam D3 may also comprise a plurality of layers surrounding the opening region C, one layer is shown in the figure as an example.

For example, in some embodiments, the third barrier dam D3 includes a plurality of barrier sub-layers, and these barrier sub-layers may be disposed in the same layer as the gate electrode 1022, the second plate 1032, and the source and drain electrodes in the display region A, so as to simplify the manufacturing process of the display substrate.

For example, in some embodiments, as shown in FIG. 3, FIG. 4, FIG. 7 and FIG. 8, the opening peripheral region B may further include a fourth barrier dam D4 on a side of the first barrier dam D1 close to the display region A, as shown in FIG. 11, light-emitting members EM of the plurality of sub-pixels includes a light-emitting material layer 1042 disposed in the plurality of sub-pixel openings 1017A. In some examples, the light-emitting material layer 1042 may be formed on the whole surface, in this case, the fourth barrier dam D4 may disconnect the light-emitting material layer 1042 formed on the whole surface, so as to prevent impurities in the opening region C from extending to the display region A along the light-emitting material layer 1042. For example, the fourth barrier dam D4 may also include a plurality of layers surrounding the opening region C, two layers are shown in the figure as an example.

For example, in some embodiments, the fourth barrier dam D4 includes a plurality of barrier sub-layers, and these barrier sub-layers may be respectively disposed in the same layer as the gate insulation layer 1014, the interlayer insulation layer 1015, and the source and drain electrodes in the display region A, so as to simplify the manufacturing process of the display substrate.

It should be noted that, for the sake of clarity and simplicity, the third barrier dam D3 and the fourth barrier dam D4 are not shown in the planar diagrams of FIGS. 2, 5-6 and 9-10. The surrounding manners of the third barrier dam D3 and the fourth barrier dam D4 are similar to that of the first barrier dam D1 and the second barrier dam D2, and the specific arrangement positions may be referred to FIG. 3, FIG. 4, FIG. 7 and FIG. 8.

For example, in some embodiments, as shown in FIG. 11, and as shown in FIG. 3, FIG. 4, FIG. 7 and FIG. 8, the light-emitting material layer 1042 further extends to the opening peripheral region B, and extends to a side of the first barrier dam D1 and the second barrier dam D2 away from the base substrate 1011, in this case, the insulating protection layer DP is located on a side of the light-emitting material layer 1042 away from the base substrate 1011. For example, in some embodiments, the cathode layer 1043 of the light-emitting member EM may also extend to the opening peripheral region B, for example, an extension range of the cathode layer 1043 is the same as an extension range of the light-emitting material layer 1042, which is not shown in the figure.

For example, as shown in FIG. 11 and FIG. 3, FIG. 4, FIG. 7 and FIG. 8, the display region A and the opening peripheral region B further include an encapsulation layer EN on a side of the light-emitting material layer 1042 away from the base substrate 1011 and a touch layer on a side of the encapsulation layer EN away from the base substrate 1011, the insulating protection layer DP is on a side of the touch layer away from the base substrate 1011. For example, the touch layer includes a first touch layer T1, a second touch layer T3 and a touch insulation layer T2 between the first touch layer T1 and the second touch layer T3, the first touch layer T1 and the second touch layer T3 respectively include touch lines. For example, the first material removal region DP1 of the insulating protection layer DP exposes the touch insulation layer T2 and/or the second touch layer T3. For example, the second material removal region DP2 and the third material removal region DP3 of the insulating protection layer DP also expose the touch insulation layer T2 and/or the second touch layer T3.

For example, in some embodiments, as shown in FIGS. 2-10, the opening peripheral region B may further include a detection line PC for detecting whether a crack exists in the substrate, but the embodiments of the present disclosure are not limited to the case including the detection line, that is, there may be no detection line. The detection line PC at least partially surrounds the opening region C, for example, the detection line PC is disposed on a side of the second barrier dam D2 close to the opening region C. During the manufacturing process of the display substrate, the detection line PC may be connected to an external circuit to detect whether a line in the display substrate is broken after the opening region C is formed in the display substrate. For example, as shown in FIG. 2, two ends of the detection line PC (two ends on an upper side of the detection line PC shown in the figure) may be connected to an external circuit, and a resistance of the detection line PC can be detected by the external circuit, in a case that the resistance of the detection line PC is within a normal range, the detection line PC is not broken, so it can be judged that other lines or structural layers on the display substrate are not broken; in a case that the resistance of the detection line PC exceeds the normal range, for example, the resistance is very large, it is judged that the detection line PC is broken, and it can be judged that other lines or structural layers on the display substrate may also be broken.

For example, in the direction perpendicular to the surface of the base substrate 1011, the detection line PC is not overlapped with the first material removal region DP1. For example, the detection line PC is not overlapped with the second material removal region DP2 and the third material removal region DP3 either. For example, in some embodiments, distances from the detection line PC to the first material removal region DP1, the second material removal region DP2 and the third material removal region DP3 range from 40 μm to 60 μm, such as 45 μm, 50 μm or 60 μm, etc. In this case, the insulating protection layer DP fully covers the detection line PC to protect the detection line PC.

For example, in some embodiments, the detection line PC is in the same layer as the first touch layer T1 and/or the second touch layer T3, thereby simplifying the manufacturing process of the display substrate. For example, in some examples, the detection line PC may include two electrically connected portions, and the two electrically connected portions are respectively disposed in the same layer as the first touch layer T1 and the second touch layer T3; or, in some embodiments, the detection line PC may also be provided in the same layer as only one of the first touch layer T1 and the second touch layer T3. The embodiments of the present disclosure do not limit the specific arrangement of the detection line PC.

For example, in some embodiments, a material of the insulating protection layer DP includes an organic insulating material, such as polyimide.

For example, in some embodiments, the display substrate may be a flexible display substrate. In this case, the base substrate 1011 may include a flexible insulation material such as polyimide (PI). For example, in some examples, the base substrate 1011 may be a stacked structure in which a plurality of flexible layers and a plurality of barrier layers are alternately arranged, such as a stacked structure in which two flexible layers and two barrier layers are alternately arranged. In this case, the flexible layer may include polyimide, and the barrier layer may include an inorganic insulating material such as silicon oxide, silicon nitride, silicon oxynitride, or the like.

For example, the active layer 1021 may adopt a material such as polysilicon or metal oxide, the gate insulation layer 1014 may adopt an inorganic insulating material such as silicon oxide, silicon nitride, silicon oxynitride, or the like, and the gate electrode 1022 and the first plate 1031 may adopt a metal material such as copper, aluminum, titanium and cobalt, for example, may be formed into a single-layer structure or a multi-layer structure, such as a multi-layer structure of titanium/aluminum/titanium or molybdenum/aluminum/molybdenum, the second plate 1032 may adopt a metal such as copper, aluminum, titanium, cobalt, or an alloy material thereof, the interlayer insulation layer 1015 may adopt an inorganic insulating material such as silicon oxide, silicon nitride, silicon oxynitride, or the like. The source and drain electrodes 1023 and 1024 may adopt a metal material such as copper, aluminum, titanium and cobalt, for example, may be formed into a single-layer structure or a multi-layer structure, such as a multi-layer structure of titanium/aluminum/titanium or molybdenum/aluminum/molybdenum, and a material of the anode layer 1041 may include a metal oxide such as ITO and IZO or a metal such as Ag, Al and Mo or an alloy material thereof. A material of the light-emitting layer 1042 and a material of the auxiliary light-emitting layer are organic materials. The material of the light-emitting layer 1042 may select a light-emitting material that can emit a certain color light (such as red light, blue light, green light, etc.) according to requirements. The material of the cathode layer 1043 may include a metal such as Mg, Ca, Li, Al or an alloy material thereof, or a metal oxide such as IZO and ZTO, or an organic material with conductive properties such as PEDOT/PSS (poly 3,4-ethylene dioxythiophene/polystyrene sulfonate). The planarization layer 1016, the pixel definition layer 1017 and the spacer 1018 may adopt organic insulation materials such as polyimide. The first touch layer T1 and the second touch layer T3 may include a metal material such as copper, aluminum, titanium and cobalt or a metal oxide such as ITO and IZO, and the touch insulation layer T2 may include an organic insulating material such as polyimide. The embodiments of the present disclosure do not specifically limit the material of each functional layer.

At least one embodiment of the present disclosure further provides a display device, the display device includes a display substrate provided by at least one embodiment of the present disclosure.

Figure 12:
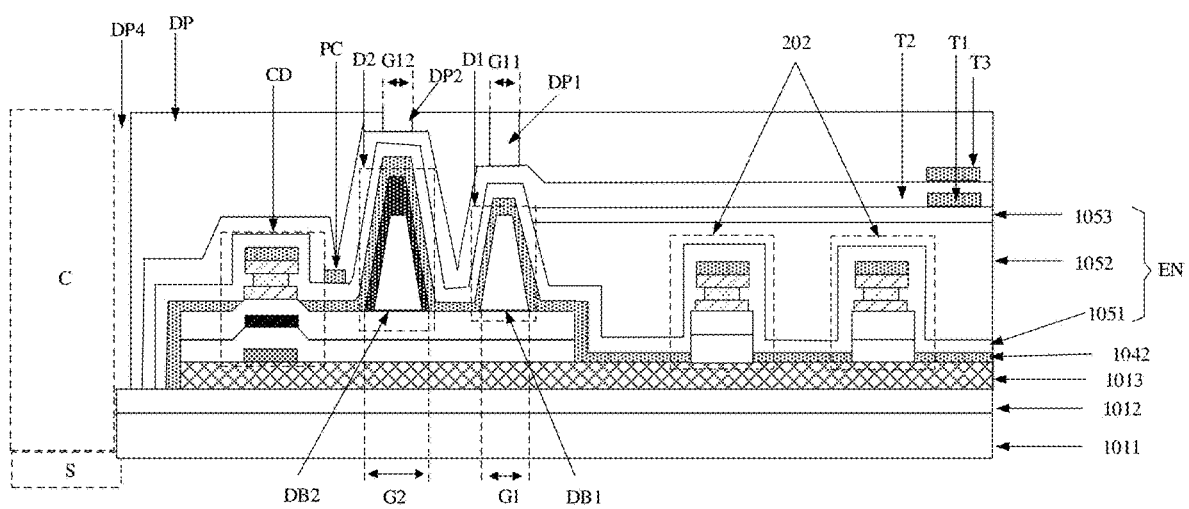
FIG. 12 is a cross-sectional diagram of a display device provided by at least one embodiment of the present disclosure.

For example, FIG. 12 shows a cross-sectional diagram of a display device provided by at least one embodiment of the present disclosure. As shown in FIG. 12, the display device further includes a light sensing member S, the display substrate has a display side (an upper side shown in the figure) and a non-display side (a lower side shown in the figure), the light sensing member S is arranged on the non-display side and is at least partially overlapped with the opening region C in a direction perpendicular to the surface of the substrate 1011.

For example, the light sensing member S may be various forms of light sensing members such as a camera, an infrared sensor, or the like. The light sensing member S can receive the light transmitted from the display side of the display panel through the opening region C, and then realize the corresponding functions, such as photographing and infrared sensing, or the like.

At least one embodiment of the present disclosure provides further a manufacturing method of a display substrate, the manufacturing method includes forming an opening forming region, a display region at least partially surrounding the opening forming region, and an opening peripheral region between the opening forming region and the display region, the manufacturing method further includes: providing a base substrate; in the opening peripheral region, forming a first barrier dam on the base substrate and forming an insulating protection layer on a side of the first barrier dam away from the base substrate, in which the first barrier dam at least partially surrounds the opening forming region, the insulating protection layer includes at least one first material removal region, and a projection of the first material removal region on the base substrate is overlapped with a projection of the first barrier dam on the base substrate; and at least partially removing a material of the insulating protection layer in the at least one first material removal region to form a recess portion in the insulating protection layer or a through hole penetrating the insulating protection layer.

Figure 13:
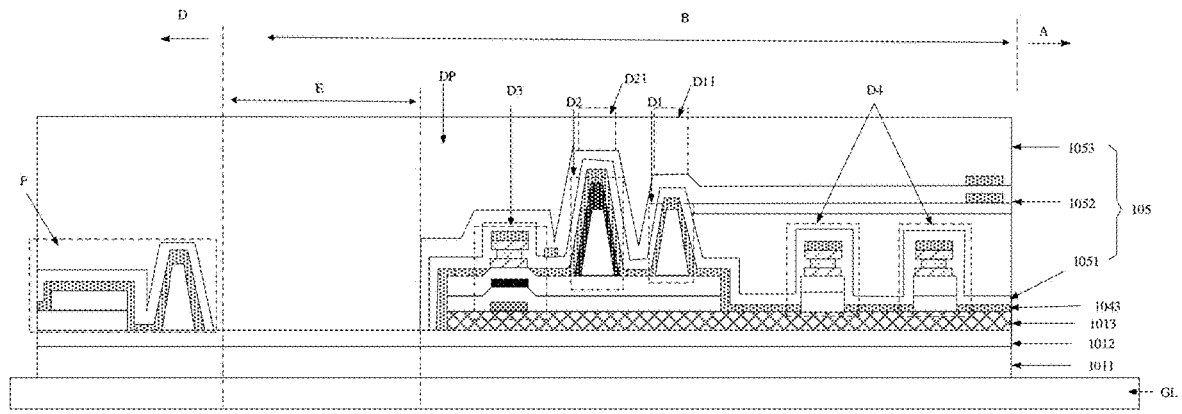
FIGS. 13-15 are cross-sectional diagrams of a display device in a manufacture process provided by at least one embodiment of the present disclosure.

For example, in some embodiments, the display substrate may be a flexible display substrate. In this case, as shown in FIG. 13, providing the base substrate includes forming the base substrate 1011 on a rigid substrate GL. For example, the rigid substrate GL may be a glass substrate. The base substrate 1011 is divided into an opening forming region D, a display region A at least partially surrounding the opening forming region D, and an opening peripheral region B between the opening forming region D and the display region A.

Then, the first barrier dam D1 is formed in the opening peripheral region B and on the base substrate 1011, for example, the second barrier dam D2, the third barrier dam D3 and the fourth barrier dam D4 are also formed, and an insulating protection layer DP is formed on a side of the first barrier dam D1 (and the second barrier dam D2, the third barrier dam D3 and the fourth barrier dam D4) away from the base substrate 1011. A driving circuit layer, a light-emitting member, and the like are formed in the display region A. The specific manufacturing methods of the above functional structures may refer to relevant technologies and will not be repeated here.

For example, as shown in FIG. 13, while the respective functional structures described above are formed in the opening peripheral region B and the display region A, a dummy functional structure F is formed in the opening forming region D, and the dummy functional structure F, for example, has a sub-pixel similar to the display region. The opening forming region D will be removed in a subsequent manufacture process to form an opening region.

Figure 14:
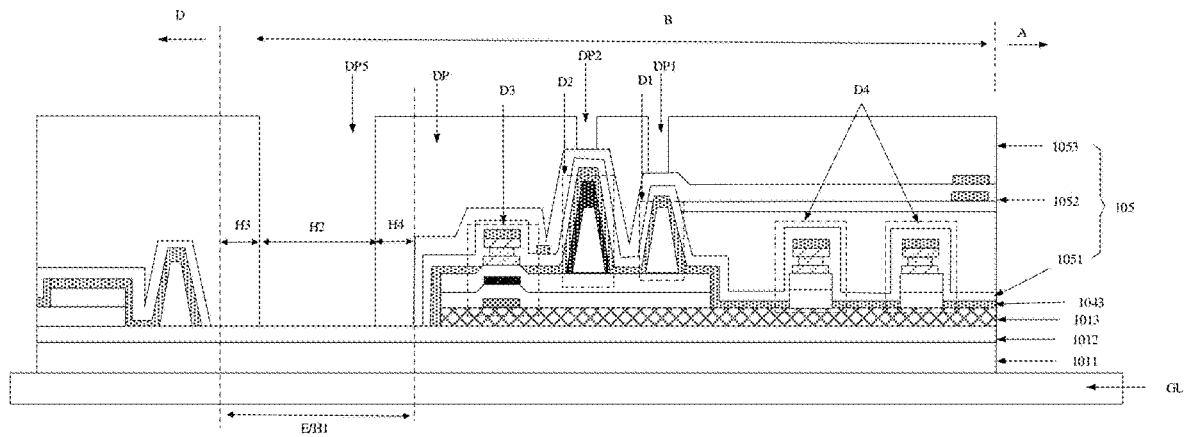

For example, as shown in FIG. 13, the insulating protection layer DP includes a first portion D11 overlapping the first barrier dam D1, and the first portion D11 includes at least one first material removal region DP1. During the manufacturing process, the material of the insulating protection layer DP in the first material removal region DP1 is at least partially removed to form a recess portion in the insulating protection layer DP or a through hole penetrating the insulating protection layer DP, as shown in FIG. 14, the material of the insulating protection layer DP in the first material removal region DP1 is completely removed to form a through hole penetrating the insulating protection layer DP.

For example, as shown in FIG. 13, the insulating protection layer DP further includes a second portion D21 overlapping the second barrier dam D2, and the second portion D21 includes at least one second material removal region DP2. During the manufacturing process, the material of the insulating protection layer DP in the second material removal region DP2 is at least partially removed to form a recess portion in the insulating protection layer DP or a through hole penetrating the insulating protection layer DP, as shown in FIG. 14, the material of the insulating protection layer DP in the second material removal region DP2 is completely removed to form a through hole penetrating the insulating protection layer DP.

For example, in some embodiments, the insulating protection layer DP may further include a third material removal region DP3 extending between the first barrier dam D1 and the second barrier dam D2. During the manufacturing process, the material of the insulating protection layer DP in the third material removal region DP3 is at least partially removed to form a recess portion in the insulating protection layer DP or a through hole penetrating the insulating protection layer DP. For details, please refer to FIG. 7 and FIG. 8.

For example, in some embodiments, as shown in FIG. 13, the opening peripheral region B includes an opening cutting region E on a side of the opening peripheral region B close to the opening forming region D, and the opening cutting region E at least partially surrounds the opening forming region D. As shown in FIG. 14, the insulating protection layer DP includes a fifth material removal region DP5 in the opening cutting region. In this case, the manufacturing method further includes: at least partially removing the material of the insulating protection layer DP in the fifth material removal region DP5 to form a recess portion in the insulating protection layer DP or a through hole penetrating the insulating protection layer DP. FIG. 14 shows that the material of the insulating protection layer DP in the fifth material removal region DP5 are completely removed to form a through hole penetrating the insulating protection layer DP.

For example, the material removal process for the first material removal region DP1, the second material removal region DP2, the third material removal region DP3 and the fifth material removal region DP5 may be carried out through one patterning process using the same mask, so as to simplify the manufacturing process of the display substrate. For example, one patterning process includes processes such as photoresist formation, exposure, development, etching and the like. In some examples, in a case that the material of the insulating protection layer DP is a photoresist material, the material removal process of the insulating protection layer DP may only include exposure and development.

For example, in some examples, in a case that the material in the material removal region is removed by etching or developing, the etching solution or developing solution used has isotropic characteristics. Therefore, in a case that widths of the first material removal region DP1 and the second material removal region DP2 are different, etching depths of the first material removal region DP1 and the second material removal region DP2 are generally different. In some examples, shapes and sizes of the plurality of first material removal regions DP1 are the same, so etching widths and depths of the plurality of first material removal regions DP1 are generally the same; similarly, shapes and sizes of the plurality of second material removal regions DP2 are the same, so etching widths and depths of the plurality of second material removal regions DP2 are generally the same.

For example, after the above material removal process is completed, the manufacturing method may further include a polishing process to ensure the surface regularity of the insulating protection layer DP.

Figure 15:
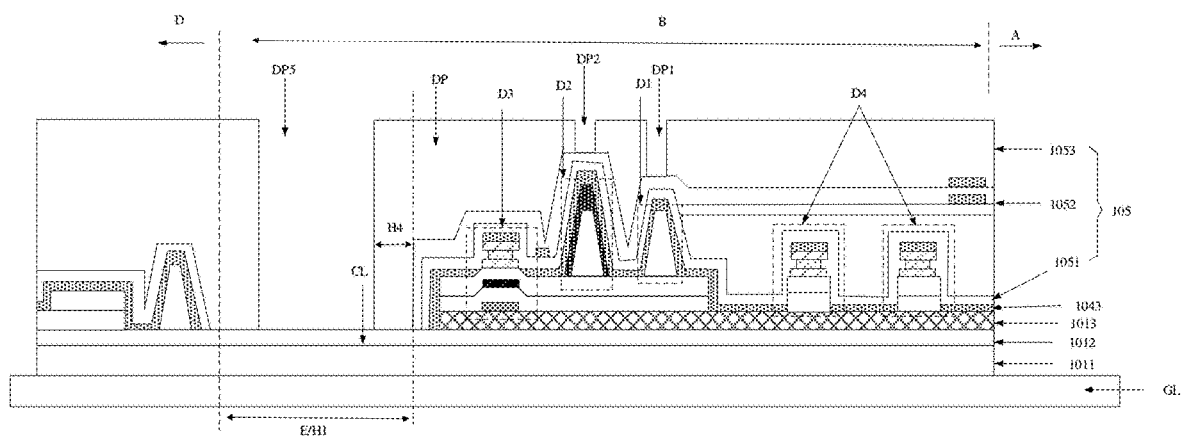
Figure 16:
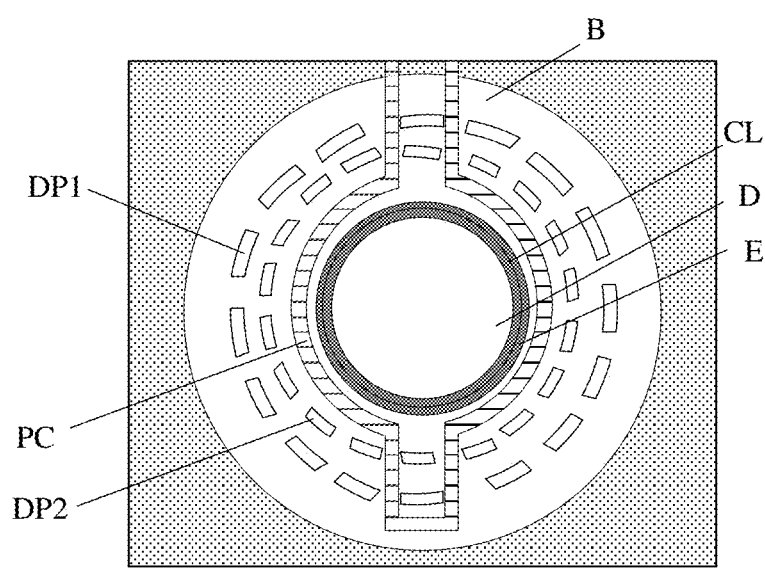
FIG. 16 is a planar diagram of a display device in a manufacture process provided by at least one embodiment of the present disclosure.

For example, as shown in FIG. 15 and FIG. 16, the opening cutting region E is an annular region surrounding the opening forming region D, and the manufacturing method further includes: determining a cutting line CL at least partially surrounding (for example, completely surrounding) the opening forming region D in the opening cutting region E, and cutting the display substrate along the cutting line CL to separate the opening forming region D from the display substrate to form the opening region C, referring to FIG. 4.

For example, in some embodiments, as shown in FIG. 14, in the direction perpendicular to the extension direction of the opening cutting region E, a width H1 of the opening cutting region ranges from 350 µm to 450 µm, for example, 380 µm, 400 µm or 420 µm, etc.

For example, the fifth material removal region DP5 at least partially surrounds the opening region C, in the direction perpendicular to the extension direction of the fifth material removal region DP5, a width H2 of the fifth material removal region DP5 ranges from 150 µm to 250 µm, for example, 180 µm, 200 µm or 220 µm, etc. The distances H3 and H4 from the fifth material removal region DP5 to edges of the opening cutting region E range from 50 µm to 150 µm, for example, 80 µm, 100 µm, or 120 µm, etc.

For example, in a case that the cutting line CL is at a position shown in FIG. 15, after cutting and removing the opening forming region D, a fourth material removal region DP4 is formed in the display substrate as shown in FIG. 4.

For example, after the functional layers on the base substrate 1011 are all formed, a laser stripping process is performed to separate the base substrate 1011 from the rigid substrate GL. For example, the laser may irradiate from one side of the glass substrate GL, so that sufficient energy can be obtained at the interface between the base substrate 1011 and the glass substrate GL, the adhesion between the base substrate 1011 and the glass substrate GL is gradually weakened, and finally the base substrate 1011 is separated from the glass substrate GL.

In the manufacturing method provided by at least one embodiment of the present disclosure, because the insulating protection layer above the first barrier dam and the second barrier dam is formed with a plurality of material removal regions near (for example, above and on a side) the first barrier dam and the second barrier dam, during the manufacturing process, the energy generated by the first barrier dam and the second barrier dam due to heating (for example, laser irradiation) can be dissipated through the plurality of material removal regions of the insulating protection layer, thereby weakening or eliminating the possible thermal expansion phenomenon of the first barrier dam and the second barrier dam, avoiding the layer stripping phenomenon, ensuring the integrity of the display substrate, and improving the manufacture yield of the display substrate.

The following statements should be noted.

(1) The accompanying drawings involve only the structure(s) in connection with the embodiment(s) of the present disclosure, and other structure(s) may be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale. It should understood that, in the case in which a component or element such as a layer, film, region, substrate or the like is referred to be "on" or "under" another component or element, it may be directly on or under the another component or element or a component or element is interposed therebetween.

(3) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A display substrate, having an opening region, a display region at least partially surrounding the opening region, and an opening peripheral region between the opening region and the display region, and comprising a base substrate,
   wherein the opening peripheral region comprises a first barrier dam on the base substrate and an insulating protection layer on a side of the first barrier dam away from the base substrate,
   the first barrier dam at least partially surrounds the opening region, the insulating protection layer comprises at least one first material removal region, and a projection of the first material removal region on the base substrate is overlapped with a projection of the first barrier dam on the base substrate; in the at least one first material removal region, a material of the insulating protection layer is at least partially removed, to form a recess portion in the insulating protection layer or a through hole penetrating the insulating protection layer.

2. The display substrate according to claim 1, wherein the insulating protection layer further comprises an opening in the opening region.

3. The display substrate according to claim 1, wherein the at least one first material removal region comprises a plurality of first material removal regions spaced from each other along an extension direction of the first barrier dam.

4. The display substrate according to claim 3, wherein the first barrier dam has a first bottom surface close to the base substrate,
   in a direction parallel to a surface of the base substrate and perpendicular to the extension direction of the first barrier dam, a width of each of the plurality of first material removal regions is less than a width of the first bottom surface.

5. The display substrate according to claim 4, wherein a ratio of the width of each of the plurality of first material removal regions to the width of the first bottom surface ranges from 0.3 to 0.7, wherein the width of each of the plurality of first material removal regions ranges from 15 µm to 25 µm;
   a length of each of the plurality of first material removal regions in the extension direction of the first barrier dam ranges from 8 µm to 12 µm; and
   an interval between two adjacent first material removal regions in the extension direction of the first barrier dam ranges from 3 µm to 7 µm.

6. The display substrate according to claim 1, wherein the opening peripheral region further comprises a second barrier dam on the base substrate,
   the second barrier dam at least partially surrounds the opening region and is on a side of the first barrier dam close to the opening region,
   the insulating protection layer is further on a side of the second barrier dam away from the base substrate; the insulating protection layer comprises at least one second material removal region, and a projection of the second material removal region on the base substrate is overlapped with a projection of the second barrier dam on the base substrate; in the at least one second material removal region, a material of the insulating protection layer is at least partially removed, to form a recess portion in the insulating protection layer or a through hole penetrating the insulating protection layer.

7. The display substrate according to claim 6, wherein the at least one second material removal region comprises a plurality of second material removal regions spaced from each other along an extension direction of the second barrier dam,
    wherein the second barrier dam has a second bottom surface close to the base substrate,
    in a direction parallel to a surface of the base substrate and perpendicular to the extension direction of the second barrier dam, a width of each of the plurality of second material removal regions is less than a width of the second bottom surface.

8. The display substrate according to claim 7, wherein a ratio of the width of each of the plurality of second material removal regions to the width of the second bottom surface ranges from 0.3 to 0.7,
    wherein the width of each of the plurality of second material removal regions ranges from 8 μm to 12 μm;
    a length of each of the plurality of second material removal regions in the extension direction of the second barrier dam ranges from 8 μm to 12 μm; and
    an interval between two adjacent second material removal regions in the extension direction of the second barrier dam ranges from 3 μm to 7 μm.

9. The display substrate according to claim 6, wherein the insulating protection layer further comprises a third material removal region extending between the first barrier dam and the second barrier dam, in the third material removal region, a material of the insulating protection layer is at least partially removed, to form a recess portion in the insulating protection layer or a through hole penetrating the insulating protection layer.

10. The display substrate according to claim 6, wherein the insulating protection layer further comprises a fourth material removal region at an edge of the opening peripheral region close to the opening region,
    in the fourth material removal region, a material of the insulating protection layer is at least partially removed, to form a recess portion in the insulating protection layer or a through hole penetrating the insulating protection layer, and the fourth material removal region is communicated with the opening region.

11. The display substrate according to claim 6, wherein the display region has a plurality of sub-pixels array, and comprises a driving circuit layer, a planarization layer and a pixel definition layer sequentially arranged on the base substrate,
    the pixel definition layer comprises a plurality of sub-pixel openings, each of the plurality of sub-pixels comprises a light-emitting member at least partially disposed in one of the plurality of sub-pixel openings and a pixel driving circuit disposed in the driving circuit layer and configured to drive the light-emitting member;
    the first barrier dam is in a same layer with at least one of the planarization layer and the pixel definition layer.

12. The display substrate according to claim 11, wherein the second barrier dam comprises a first barrier layer and a second barrier layer that are stacked, the first barrier layer is in a same layer with the planarization layer, and the second barrier layer is in a same layer with the pixel definition layer.

13. The display substrate according to claim 11, wherein light-emitting members of the plurality of sub-pixels comprise a light-emitting material layer in the plurality of sub-pixel openings,
    the light-emitting material layer further extends to the opening peripheral region and to sides of the first barrier dam and the second barrier dam away from the base substrate, and
    the insulating protection layer is on a side of the light-emitting material layer away from the base substrate.

14. The display substrate according to claim 13, wherein the display region and the opening peripheral region further comprise an encapsulation layer on a side of the light-emitting material layer away from the base substrate and a touch layer on a side of the encapsulation layer away from the base substrate,
    the insulating protection layer is on a side of the touch layer away from the base substrate, and the touch layer comprises a first touch layer, a second touch layer and a touch insulation layer between the first touch layer and the second touch layer,
    the at least one first material removal region of the insulating protection layer exposes the touch insulation layer and/or the second touch layer.

15. The display substrate according to claim 14, wherein the opening peripheral region further comprises a detection line, the detection line at least partially surrounds the opening region, and in a direction perpendicular to the surface of the base substrate, the detection line is not overlapped with the at least one first material removal region,
    wherein the detection line is in a same layer with the first touch layer and/or the second touch layer.

16. A display device, comprising the display substrate according to claim 1.

17. The display device according to claim 16, further comprising a light sensing member,
    wherein the display substrate has a display side and a non-display side, the light sensing member is on the non-display side, and in a direction perpendicular to a surface of the base substrate, the light sensing member is at least partially overlapped with the opening region.

18. A manufacturing method of a display substrate, comprising forming an opening forming region, a display region at least partially surrounding the opening forming region, and an opening peripheral region between the opening forming region and the display region, wherein the manufacturing method further comprises:
    providing a base substrate,
    in the opening peripheral region, forming a first barrier dam on the base substrate and forming an insulating protection layer on a side of the first barrier dam away from the base substrate, wherein the first barrier dam at least partially surrounds the opening forming region, the insulating protection layer comprises at least one first material removal region, and a projection of the first material removal region on the base substrate is overlapped with a projection of the first barrier dam on the base substrate; and
    at least partially removing a material of the insulating protection layer in the at least one first material removal region, to form a recess portion in the insulating protection layer or a through hole penetrating the insulating protection layer.

19. The manufacturing method according to claim 18, wherein the opening peripheral region comprises an opening cutting region on a side of the opening peripheral region close to the opening forming region, and the opening cutting region at least partially surrounds the opening forming region, the insulating protection layer comprises a fifth material removal region in the opening cutting region, and the manufacturing method further comprises:

at least partially removing a material of the insulating protection layer in the fifth material removal region, to form a recess portion in the insulating protection layer or a through hole penetrating the insulating protection layer, wherein in a direction perpendicular to an extension direction of the opening cutting region, a width of the opening cutting region ranges from 350 μm to 450 μm, wherein the fifth material removal region at least partially surrounds the opening forming region, and in a direction perpendicular to an extension direction of the fifth material removal region, a width of the fifth material removal region ranges from 150 μm to 250 μm, and a distance between the fifth material removal region and an edge of the opening cutting region ranges from 50 μm to 150 μm.

20. The manufacturing method according to claim 19, further comprising:

determining a cutting line at least partially surrounding the opening forming region in the opening cutting region, and cutting the display substrate along the cutting line, to separate the opening forming region from the display substrate to form an opening region.

\* \* \* \* \*